(12) United States Patent
Wang et al.

(10) Patent No.: US 11,894,772 B2
(45) Date of Patent: Feb. 6, 2024

(54) METHOD FOR PROVIDING DYNAMIC VOLTAGE REGULATOR CHARACTERISTIC CHANGES

(71) Applicant: Dell Products L.P., Round Rock, TX (US)

(72) Inventors: Isaac Qin Wang, Austin, TX (US); Andy ChinJui Liu, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 65 days.

(21) Appl. No.: 17/824,103

(22) Filed: May 25, 2022

(65) Prior Publication Data
US 2023/0387799 A1 Nov. 30, 2023

(51) Int. Cl.
G06F 1/32 (2019.01)
H02M 3/158 (2006.01)
G06F 1/3296 (2019.01)
G11C 11/4074 (2006.01)

(52) U.S. Cl.
CPC .......... H02M 3/158 (2013.01); G06F 1/3296 (2013.01); G11C 11/4074 (2013.01)

(58) Field of Classification Search
CPC .............. G06F 1/32; G06F 9/44; H02M 3/158
See application file for complete search history.

(56) References Cited

U.S. PATENT DOCUMENTS

| 9,857,854 | B2 | 1/2018 | Zhang et al. |
| 9,887,642 | B2 | 2/2018 | Safamehr et al. |
| 2003/0169024 | A1* | 9/2003 | Cook ..................... H02M 3/156 323/268 |
| 2022/0404883 | A1* | 12/2022 | Mathiyalagan ........... G06F 1/26 |

* cited by examiner

*Primary Examiner* — Keshab R Pandey
(74) *Attorney, Agent, or Firm* — Larson Newman, LLP

(57) ABSTRACT

An information handling system includes a DDR5 DIMM and a voltage regulator. The voltage regulator provides a voltage rail to the DDR5 DIMM. In a first mode, the voltage rail is based upon a pulse frequency modulation, and in a second mode, the voltage rail is based upon a forced continuous conduction mode). Selection of one of modes is based upon an input to the voltage regulator. When the information handling system is in a first state, the information handling system provides an input signal to the input to direct the voltage regulator to operate in the first state, and when the information handling system is in a second state associated with a sleep mode of the information handling system, the information handling system provides the first input signal to the first input of the voltage regulator to direct the voltage regulator to operate in the second state.

20 Claims, 4 Drawing Sheets

METHOD FOR PROVIDING DYNAMIC VOLTAGE REGULATOR CHARACTERISTIC CHANGES

FIELD OF THE DISCLOSURE

This disclosure generally relates to information handling systems, and more particularly relates to providing dynamic voltage regulator characteristic changes.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a DDR5 DIMM and a voltage regulator. The voltage regulator may provide a voltage rail to the DDR5 DIMM. In a first mode, the voltage rail may be based upon a Pulse Frequency Modulation (PFM), and in a second mode, the voltage rail may be based upon a Forced Continuous Conduction Mode (FCCM). Selection of one of modes may be based upon an input to the voltage regulator. When the information handling system is in a first state, the information handling system may provide an input signal to the input to direct the voltage regulator to operate in the first state, and when the information handling system is in a second state associated with a sleep mode of the information handling system, the information handling system may provide the first input signal to the first input of the voltage regulator to direct the voltage regulator to operate in the second state.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
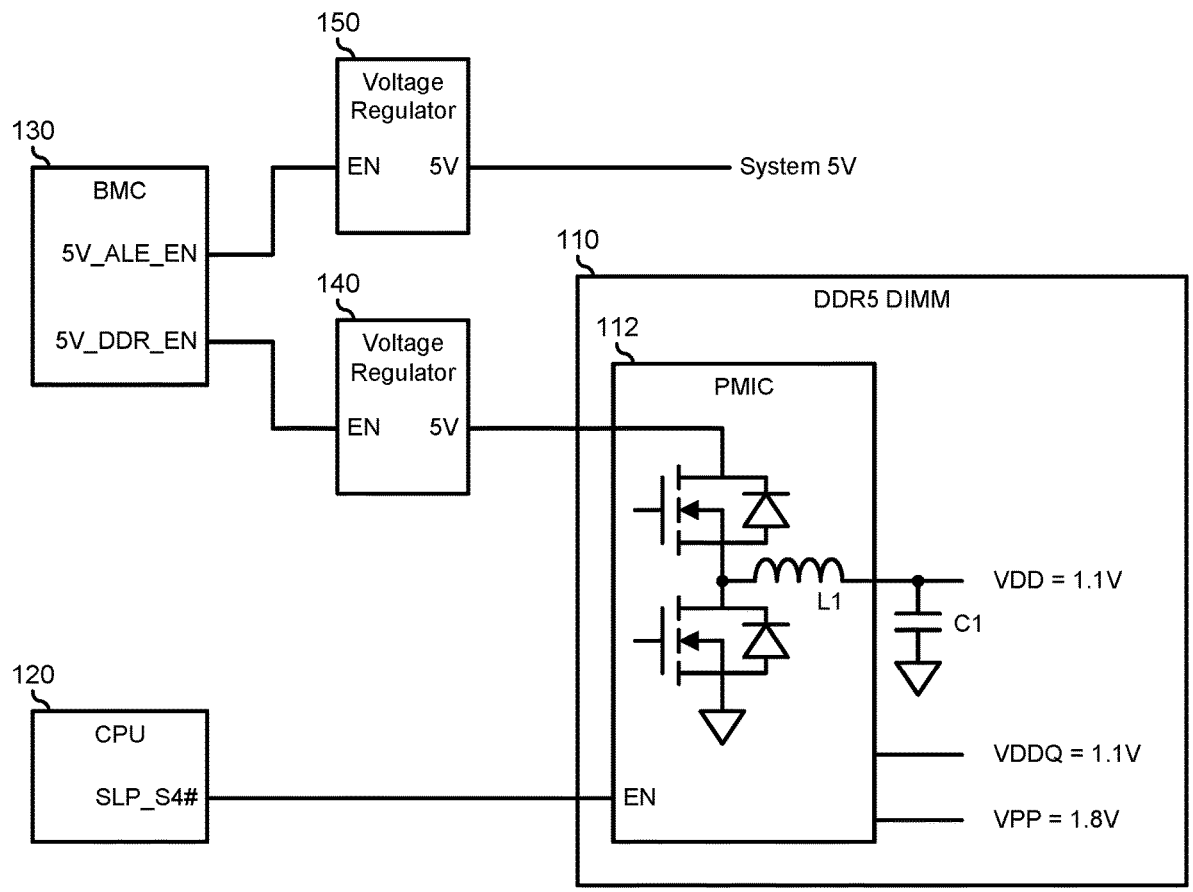
FIG. 1 is a block diagram of an information handling system according to the prior art.
Figure 1:
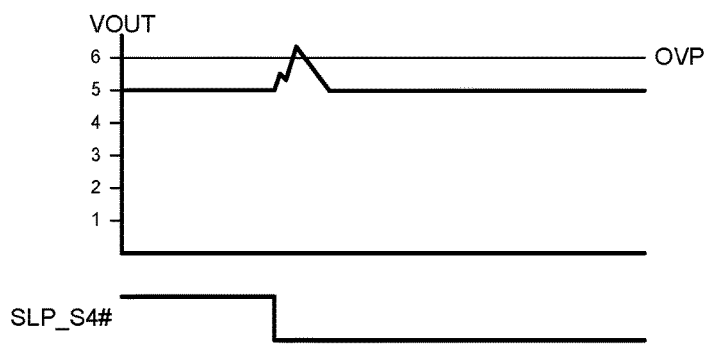

FIG. 1 illustrates an information handling system 100 according to the prior art. Information handling system 100 includes a fifth generation Double Data Rate (DDR5) Dual In-Line Memory Module (DIMM) 110, a central processing unit (CPU) 120, a baseboard management controller 130, and voltage regulators 140 and 150. DDR5 DIMM 110 includes a Power Management Integrated Circuit (PMIC) 112. PMIC 112 includes one or more power converters that receive a five (5) volt input from voltage regulator 140, and that converts the 5-volt input to the various output voltages utilized internally on DDR5 DIMM 110. As illustrated, a power converter is provided that steps the 5-volt input down to a 1.1-volt output (VDD). PMIC 112 may further include other power converters to provide a 1.1-volt output (VDDR) and a 1.8-volt output (VPP). PMIC 112 may provide one or more internal voltage output, as needed or desired.

A defined sequence of events is provided on information handling system 100 during power-up of the information handling system, power-down of the information handling system, and the entering and exiting of various global, system, and device sleep states instantiated on the information handling system. The details of these power cycles are known in the art and will not be further described herein except as needed to illustrate the current embodiments. Generally, when information handling system 100 is powered on, BMC 130 asserts voltage regulator enabling signals to voltage regulators 140 and 150. A DDR voltage regulator enable signal (5V_DDR_EN) is provided to voltage regulator 140 to power DDR5 DIMM 110 and one or more additional DDR5 DIMMs similar to DDR5 DIMM 110. A voltage regulator enable signal for all other devices of information handling system 100 (5V_ALE_EN) is provided to voltage regulator 150, which provides a 5-volt output to power other elements of the information handling system as needed or desired. At some later time in the power-up cycle, CPU 120 deasserts a Sleep-S4 signal (SLP_S4 #) (that is, places the signal in the "high" state because this signal is an "active low" signal) to enable PMIC 112 to power up the internal voltage rails within DDR5 DIMM 110.

When information handling system 100 enters the Sleep-S4 state, CPU 120 asserts the Sleep-S4 signal (SLP_S4 #) (that is, places the signal in the "low" state), thereby disabling PMIC 112 and causing the PMIC to power down the internal voltage rails within DDR5 DIMM 110. It has been understood by the inventors of the current disclosure that an unwanted over-voltage condition may be injected onto the 5-volt input line between voltage regulator 140 and PMIC 112 when information handling system 100 asserts the Sleep-S4 state (SLP_S4 #), causing the information handling system to experience an Over Voltage Protection (OVP) event which causes the information handling system to shut down. The OVP condition has been traced to a condition where, in certain circumstances, the turning off of the low-side FET of the power converters within PMIC 112 results in a negative current condition, such that the current flows from the charged capacitor C1 through the inductor L1 and the high-side FET to the 5-volt input. This condition is shown in the graph of FIG. 1, where the assertion of the Sleep-S4 signal (SLP_S4 #), that is, the transition from the high state to the low state of the signal, is accompanied by a spike on the 5-volt line that is greater than the OVP threshold (here, 6-volts).

Typical solutions to this OVP issue may include the provision of increased capacitance on the motherboard of the information handling system, the addition of a choke in the power rail, the addition of a clamping device (such as a Zener diode or the like) to the DIMM power pins, the addition of discharge circuitry to dissipate the excess energy, or the like. However, each of these solutions requires the addition of components and circuit trace routing on the already highly constrained real estate of typical information handling system motherboards.

Figure 2:
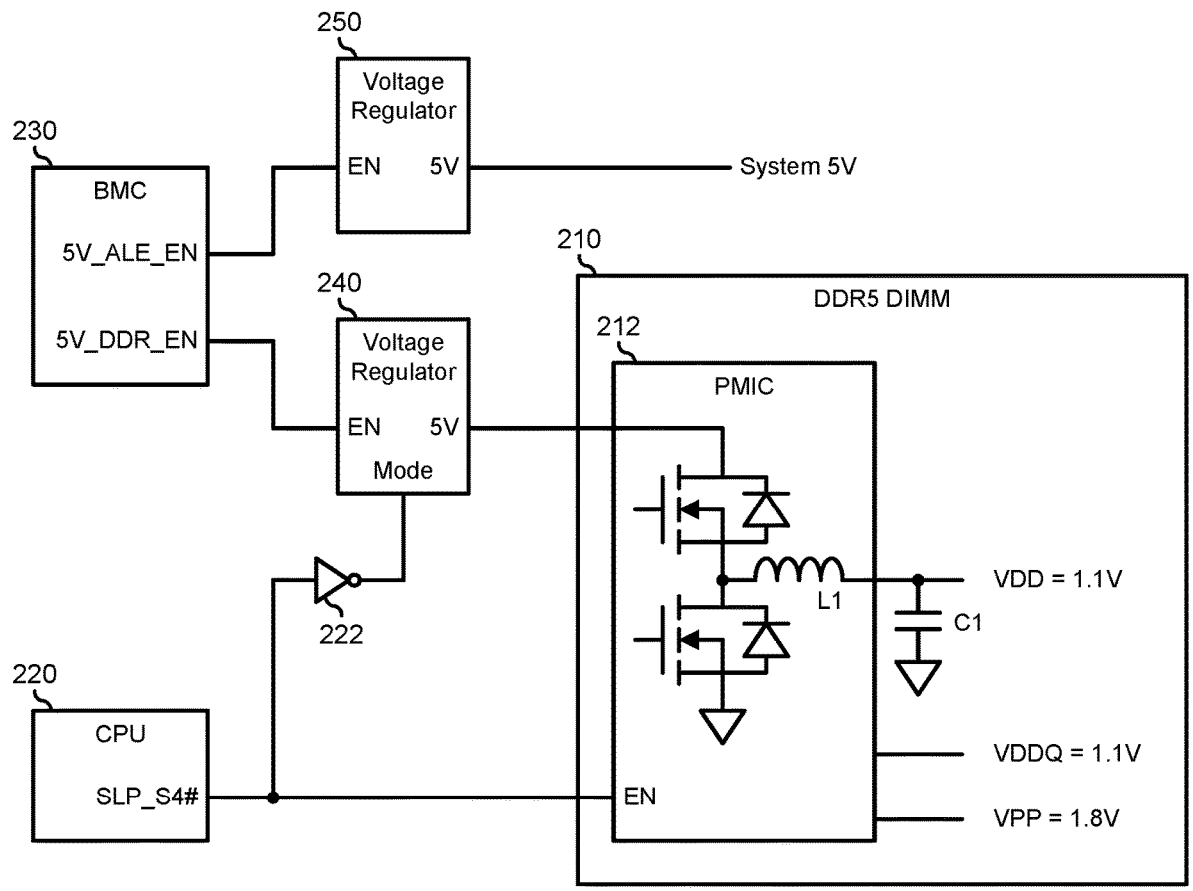
FIG. 2 is a block diagram of an information handling system according to an embodiment of the current disclosure.
Figure 2:
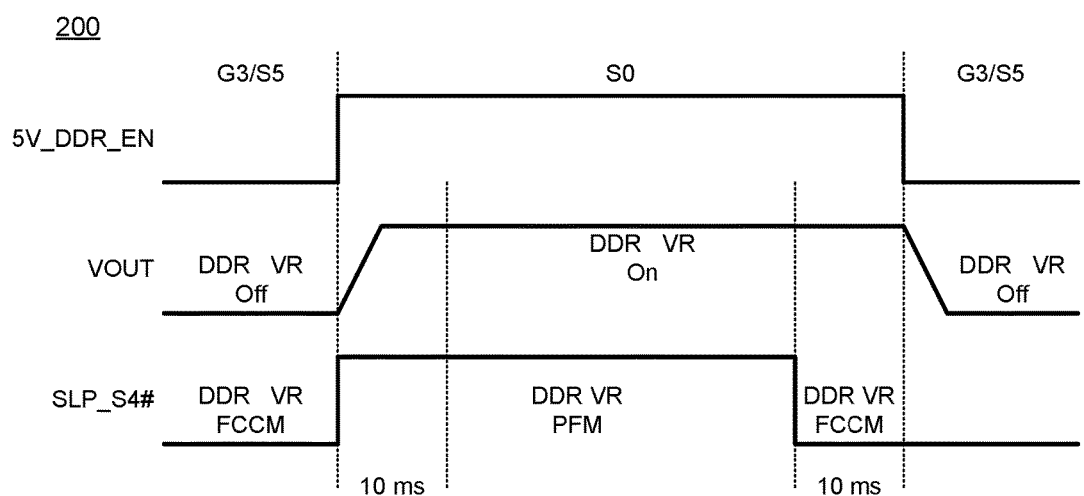

FIG. 2 illustrates an information handling system 200 including a DDR5 DIMM 210, a central processing unit (CPU) 220, an inverter circuit 222, a baseboard management controller 230, and voltage regulators 240 and 250. DDR5 DIMM 210 includes a Power Management Integrated Circuit (PMIC) 212. PMIC 212 includes one or more power converters that receive a five (5) volt input from voltage regulator 240, and that converts the 5-volt input to the various output voltages utilized internally on DDR5 DIMM 210. As illustrated, a power converter is provided that steps the 5-volt input down to a 1.1-volt output (VDD). PMIC 212 may further include other power converter to provide a 1.1-volt output (VDDR) and a 1.8-volt output (VPP). PMIC 212 may provide one or more internal voltage output, as needed or desired.

As described above, a defined sequence of events is provided on information handling system 200 during power-up of the information handling system, power-down of the information handling system, and the entering and exiting of various global, system, and device sleep states instantiated on the information handling system. Generally, when information handling system 200 is powered on, BMC 230 asserts voltage regulator enabling signals to voltage regulators 240 and 250. A DDR voltage regulator enable signal (5V_DDR_EN) is provided to voltage regulator 240 to power DDR5 DIMM 210 and one or more additional DDR5 DIMMs similar to DDR5 DIMM 210. A voltage regulator enable signal for all other devices of information handling system 200 (5V_ALE_EN) is provide to voltage regulator 250, which provides a 5-volt output to power other elements of the information handling system as needed or desired. At some later time in the power-up cycle, CPU 220 deasserts a Sleep-S4 signal (SLP_S4 #) (that is, places the signal in the "high" state because this signal is an "active low" signal) to enable PMIC 212 to power up the internal voltage rails within DDR5 DIMM 210.

In addition, the Sleep-S4 signal (SLP_S4 #) is provided to an input of inverter circuit 222 and an output of the inverter circuit is provided to a mode input of voltage regulator 240. The mode input of voltage regulator 240 operates in a first (low) state to place the voltage regulator into a Pulse Frequency Mode (PFM) of operation, and in a second (high) state, to place the voltage regulator into a Forced Continuous Conduction Mode (FCCM) of operation. Here, when information handling system 200 is powered on, and operating in a normal state (that is, not in the Sleep-S4 state), the Sleep-S4 signal (SLP_S4 #) is deasserted (high), and the deasserted (high) state is inverted to a low state by inverter circuit 222, placing voltage regulator 240 into the PFM mode of operation. The skilled artisan will understand that, operating in the PFM mode, voltage regulator 240 may exhibit higher power conversion efficiency than when operating in the FCCM mode. However, operating voltage regulator 240 in the PFM mode may leave information handling system 200 susceptible to the OVP condition when the Sleep-S4 state is entered, as described above.

However, when information handling system 200 enters the Sleep-S4 state, CPU 220 asserts the Sleep-S4 signal (SLP_S4 #) (that is, places the signal in the "low" state), thereby disabling PMIC 212 and causing the PMIC to power down the internal voltage rails within DDR5 DIMM 210. The assertion of the Sleep-S4 state further causes inverter circuit 222 to place a high state on the mode input of voltage regulator 240, causing the voltage regulator to change operation from the PFM mode to the FCCM mode. The FCCM mode operates to force voltage regulator 240 to maintain a constant switching frequency, allowing power to dissipate on the 5-volt rail during a portion of the switching cycle when a low-side FET of the voltage regulator is turned on, thereby effectively draining the power capacitor C1 of DDR5 DIMM 210 and any other DDR5 DIMMS populating information handling system 200, without causing a voltage spike on the 5-volt power rail.

In a typical information handling system, such as information handling system 100, when a BMC detects the assertion of the Sleep-S4 state (SLP_S4 #), the BMC instantly deasserts the DDR voltage regulator enable signal (5V_DDR_EN) while maintaining the other device voltage regulator enable signal (5V_ALE_EN) as asserted, in order to retain power on the other devices of information handling system 200. However in the current embodiment, BMC 230 operates to delay the deassertion of the DDR voltage regulator enable signal (5V_DDR_EN) for a short duration, in order to keep voltage regulator 240 operating for long enough to drain the power capacitor C1 of DDR5 DIMM 210 and any other DDR5 DIMMS populating information handling system 200. For example, as shown in the timing diagram of FIG. 2, the deassertion of the DDR voltage regulator enable signal (5V_DDR_EN) may be delayed by 10 milliseconds (ms) or more, as needed or desired, in order to ensure the draining of the power capacitor C1 of DDR5 DIMM 210 and any other DDR5 DIMMS populating information handling system 200. In a particular embodiment, inverter circuit 222 may be integrated with voltage regulator 240, such that the implementation of the current embodiment necessitates only the provision of the Sleep-S4 signal trace to a mode input of the voltage regulator.

Figure 3:
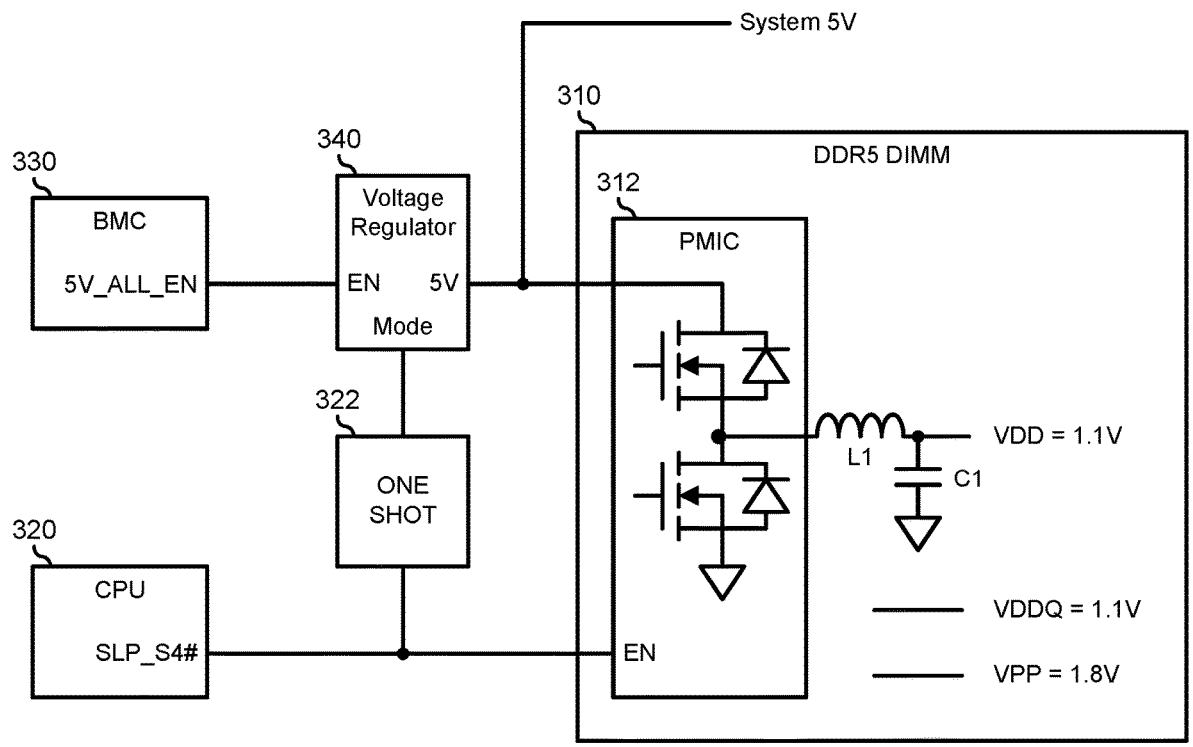
FIG. 3 is a block diagram of an information handling system according to another embodiment of the current disclosure.
Figure 3:
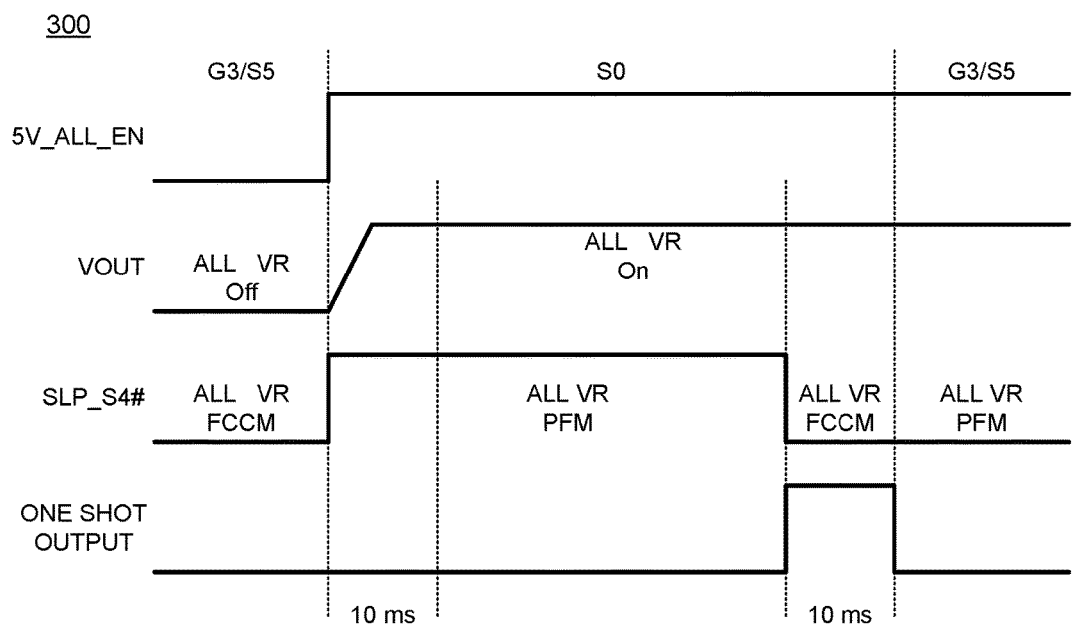

FIG. 3 illustrates an information handling system 300 including a DDR5 DIMM 310, a central processing unit (CPU) 320, a one-shot circuit 322, a baseboard management controller 330, and a voltage regulator 340. Information handling system 300 is similar to information handling system 200, except that the functions of separate voltage regulators 240 and 250 in information handling system 200 are combined into voltage regulator 340. As such, voltage regulator 340 provides the 5-volt output to DDR5 DIMM 310 and to the other devices of information handling system 300. DDR5 DIMM 310 includes a Power Management Integrated Circuit (PMIC) 312. PMIC 312 includes one or more power converters that receive the five (5) volt input from voltage regulator 340, and that converts the 5-volt input to the various output voltages utilized internally on DDR5 DIMM 310. As illustrated, a power converter is provided that steps the 5-volt input down to a 1.1-volt output (VDD). PMIC 312 may further include other power converters to provide a 1.1-volt output (VDDR) and a 1.8-volt output (VPP). PMIC 312 may provide one or more internal voltage output, as needed or desired.

As described above, a defined sequence of events are provided on information handling system 300 during power-up of the information handling system, power-down of the information handling system, and the entering and exiting of various global, system, and device sleep states instantiated on the information handling system. Generally, when information handling system 300 is powered on, BMC 330 asserts a voltage regulator enabling signal (5V_ALL_EN) to voltage regulator 340. At some later time in the power-up cycle, CPU 320 deasserts a Sleep-S4 signal (SLP_S4 #) (that is, places the signal in the "high" state because this signal is an "active low" signal) to enable PMIC 312 to power up the internal voltage rails within DDR5 DIMM 310.

In addition, the Sleep-S4 signal (SLP_S4 #) is provided to an input of one shot circuit 322 and an output of the one shot circuit is provided to a mode input of voltage regulator 340. One shot circuit 322 is configured to provide a pulse of a predetermined duration in response to a falling edge of the Sleep-S4 signal (SLP_S4 #). The mode input of voltage regulator 340 operates in a first (low) state to place the voltage regulator into a PFM mode of operation, and in a second (high) state, to place the voltage regulator into a FCCM mode of operation. When information handling system 300 is powered on, and operating in a normal state (that is, not in the Sleep-S4 state), the Sleep-S4 signal (SLP_S4 #) is deasserted (high), and the deasserted (high) state is passed by one shot circuit 322 to the mode input of voltage regulator 340, placing the voltage regulator into the PFM mode of operation. The skilled artisan will understand that, operating in the PFM mode, voltage regulator 340 may exhibit higher power conversion efficiency than when operating in the FCCM mode.

However, when information handling system 300 enters the Sleep-S4 state, CPU 320 asserts the Sleep-S4 signal (SLP_S4 #) (that is, places the signal in the "low" state), thereby disabling PMIC 312 and causing the PMIC to power down the internal voltage rails within DDR5 DIMM 310. The assertion of the Sleep-S4 state further triggers one shot circuit 322 to place a high state on the mode input of voltage regulator 340 for the predetermined duration, causing the voltage regulator to change operation from the PFM mode to the FCCM mode. The FCCM mode operates to force voltage regulator 340 to maintain a constant switching frequency, allowing power to dissipate on the 5-volt rail during a portion of the switching cycle when a low-side FET of the voltage regulator is turned on, thereby effectively draining the power capacitor C1 of DDR5 DIMM 310 and any other DDR5 DIMMS populating information handling system 300, without causing a voltage spike on the 5-volt power rail.

In the current embodiment, because voltage regulator 340 provides the 5-volt power rail to all of the elements of information handling system, the BMC does not deassert the voltage regulator enable signal (5V_ALL_EN) in response to the assertion of the Sleep-S4 signal (SLP_S4 #). Instead, the pulse provided by one shot circuit 322 forces voltage regulator 340 into the FCCM mode for the predetermined duration, and then the falling of the signal from the one shot circuit permits the voltage regulator to resume operation in the PFM mode, as shown in the timing diagram of FIG. 3. The predetermined duration of the assertion by one shot circuit 322 may be 10 milliseconds (ms) or more, as needed or desired, in order to ensure the draining of the power capacitor C1 of DDR5 DIMM 310 and any other DDR5 DIMMS populating information handling system 300. In a particular embodiment, one shot circuit 322 may be integrated with voltage regulator 340, such that the implementation of the current embodiment necessitates only the provision of the Sleep-S4 signal trace to a mode input of the voltage regulator.

Figure 4:
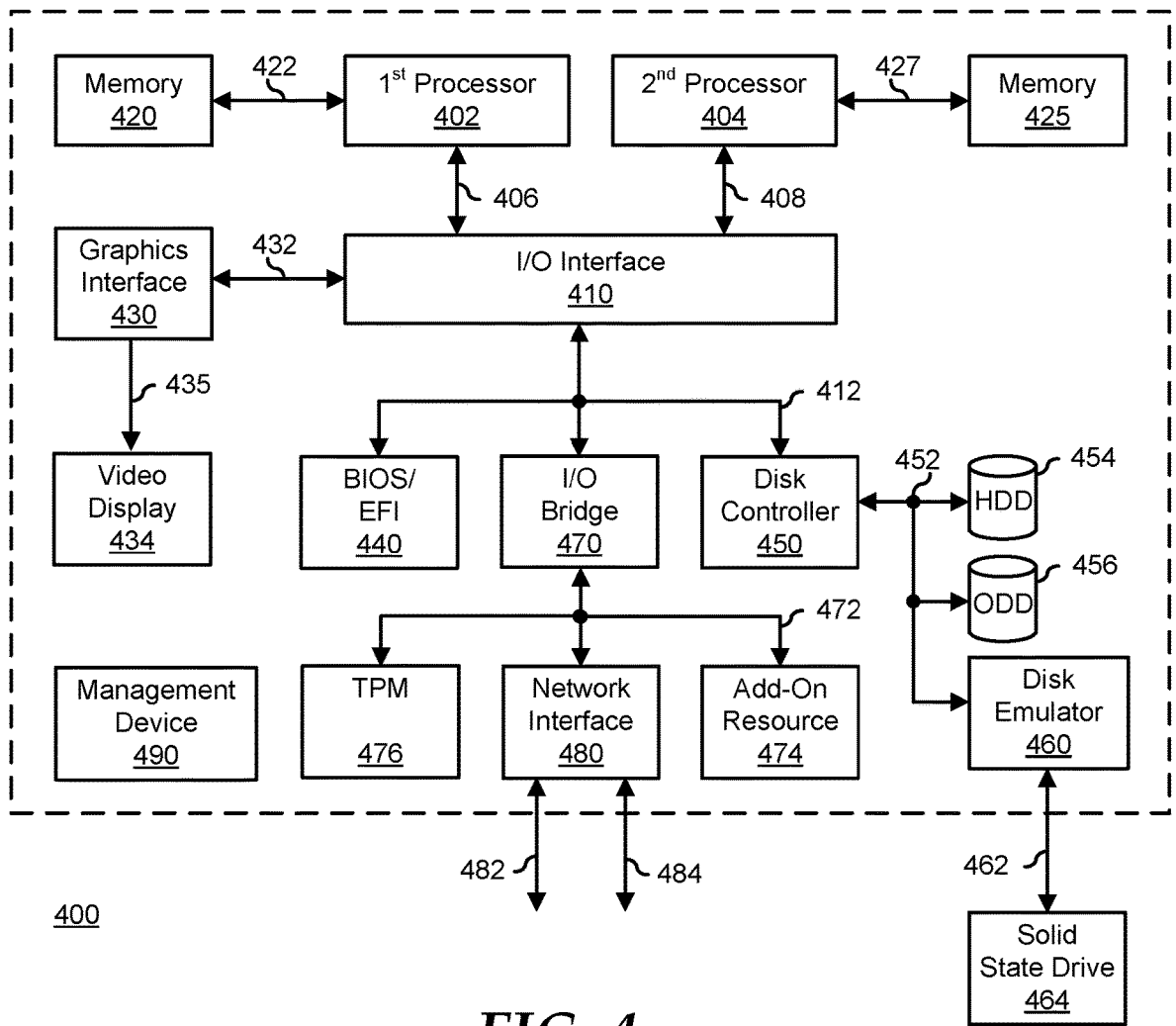
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/ UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a fifth generation Double Data Rate (DDR5) Dual In-Line Memory Module (DIMM); and
   a voltage regulator configured to provide a voltage rail to the DDR5 DIMM, wherein in a first mode, the voltage rail is based upon a pulse frequency modulation, and in a second mode, the voltage rail is based upon a forced continuous conduction mode, a selection of one of the first mode and the second mode being based upon a first input to the voltage regulator;
   wherein when the information handling system is in a first state, the information handling system provides a first input signal to the first input to direct the voltage regulator to operate in the first state, and when the information handling system is in a second state associated with a sleep mode of the information handling system, the information handling system provides the first input signal to the first input of the voltage regulator to direct the voltage regulator to operate in the second state.

2. The information handling system of claim 1, further comprising a Baseboard Management Controller configured in the first state to provide a second input signal to a second input of the voltage regulator to enable operation of the voltage regulator, and upon detection of a transition from the first state to the second state, to wait a predetermined duration, and after the predetermined duration, to provide the second input signal to disable operation of the voltage regulator.

3. The information handling system of claim 2, wherein the predetermined duration is ten milliseconds or more.

4. The information handling system of claim 1, further comprising a central processing unit configured in the first state to provide a third input signal to an input of the DDR5 DIMM to enable operation of the DDR5 DIMM, and in the second state to provide the third input signal to the input of the DDR5 DIMM to disable operation of the DDR5 DIMM.

5. The information handling system of claim 4, wherein the third input signal is associated with the sleep mode.

6. The information handling system of claim 5, wherein when the information handling system is in the first state, third input signal is in a high state, and when the information handling system is in the second state, the third input signal is in a low state.

7. The information handling system of claim 6, further comprising an inverter circuit configured to receive the third input signal at an input of the inverter circuit, and to provide the first input signal to the first input of the voltage regulator.

8. The information handling system of claim 6, further comprising a one shot circuit configured to receive the third input signal at an input of the one shot circuit, and to provide the first input signal to the first input of the voltage regulator.

9. The information handling system of claim 8, wherein the one shot circuit is further configured to provide a high state pulse as the first input signal in response to a transition of the third input signal from the high state to the low state, the high state pulse having a predetermined duration.

10. The information handling system of claim 9, wherein the predetermined duration is ten milliseconds or more.

11. A method, comprising:
    providing, by a voltage regulator of an information handling system, a voltage rail to a fifth generation Double Data Rate (DDR5) dual in-line memory module (DIMM) of the information handling system, wherein in a first mode, the voltage rail is based upon a pulse frequency modulation, and in a second mode, the voltage rail is based upon a forced continuous conduction mode;
    selecting one of the first mode and the second mode based upon a first input to the voltage regulator;
    providing, when the information handling system is in a first state, a first input signal to the first input to direct the voltage regulator to operate in the first state; and
    providing, when the information handling system is in a second state associated with a sleep mode of the information handling system, the first input signal to the first input of the voltage regulator to direct the voltage regulator to operate in the second state.

12. The method of claim 11, further comprising:
    providing, by a Baseboard Management Controller of the information handling system, a second input signal to a second input of the voltage regulator to enable operation of the voltage regulator when the information handling system is in the first state;
    waiting, by the Baseboard Management Controller, a predetermined duration after detection of a transition from the first state to the second state; and
    providing, by the Baseboard Management Controller, the second input signal to disable operation of the voltage regulator.

13. The method of claim 12, wherein the predetermined duration is ten milliseconds or more.

14. The method of claim 11, further comprising:
    providing, by a central processing unit of the information handling system, a third input signal to an input of the DDR5 DIMM to enable operation of the DDR5 DIMM when the information handling system is in the first state; and
    providing, by the central processing unit, the third input signal to the input of the DDR5 DIMM to disable operation of the DDR5 DIMM when the information handling system is in the second state.

15. The method of claim 14, wherein the third input signal is associated with the sleep mode.

16. The method of claim 15, wherein when the information handling system is in the first state, third input signal is in a high state, and when the information handling system is in the second state, the third input signal is in a low state.

17. The method of claim 16, further comprising receiving, at an input of an inverter circuit of the information handling system, the third input signal; and
providing, at an output of the inverter circuit, the first input signal to the first input of the voltage regulator.

18. The method of claim 16, further comprising:
receiving, at an input of a one shot circuit of the information handling system, the third input signal; and
providing, at an output of the one shot circuit, the first input signal to the first input of the voltage regulator.

19. The information handling system of claim 18, further comprising providing, by the one shot circuit, a high state pulse as the first input signal in response to a transition of the third input signal from the high state to the low state, the high state pulse having a predetermined duration.

20. An information handling system, comprising:
a central processing unit;
a Baseboard Management Controller: and
a fifth generation double data rate (DDR5) dual in-line memory module (DIMM);
a voltage regulator configured to provide a voltage rail to the DDR5 DIMM, wherein, in a first mode, the voltage rail is based upon a pulse frequency modulation, and in a second mode, the voltage rail is based upon a forced continuous conduction mode, a selection of one of the first mode and the second mode being based upon a first input to the voltage regulator;
wherein when the information handling system is in a first state, the information handling system provides a first input signal to the first input to direct the voltage regulator to operate in the first state, and when the information handling system is in a second state associated with a sleep mode of the information handling system, the information handling system provides the first input signal to the first input of the voltage regulator to direct the voltage regulator to operate in the second state;
wherein the Baseboard Management Controller is configured in the first state to provide a second input signal to a second input of the voltage regulator to enable operation of the voltage regulator, and upon detection of a transition from the first state to the second state, to wait a predetermined duration, and after the predetermined duration, to provide the second input signal to disable operation of the voltage regulator; and
wherein the central processing unit is configured in the first state to provide a third input signal to an input of the DDR5 DIMM to enable operation of the DDR5 DIMM, and in the second state to provide the third input signal to the input of the DDR5 DIMM to disable operation of the DDR5 DIMM.

* * * * *